(12) United States Patent
Reber et al.

(10) Patent No.: US 9,399,818 B2
(45) Date of Patent: Jul. 26, 2016

(54) METHOD AND DEVICE FOR CONTINUOUSLY COATING SUBSTRATES

(75) Inventors: Stefan Reber, Gundelfingen (DE); Norbert Schillinger, Ihringen (DE); David Pocza, Freiburg (DE); Martin Arnold, Gundelfingen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 19 days.

(21) Appl. No.: 14/131,055

(22) PCT Filed: Jul. 9, 2012

(86) PCT No.: PCT/EP2012/063425
§ 371 (c)(1),
(2), (4) Date: Feb. 26, 2014

(87) PCT Pub. No.: WO2013/004851
PCT Pub. Date: Jan. 10, 2013

(65) Prior Publication Data
US 2014/0212583 A1  Jul. 31, 2014

(30) Foreign Application Priority Data
Jul. 7, 2011 (DE) .......................... 10 2011 106 859

(51) Int. Cl.
*C23C 16/54* (2006.01)
*C23C 16/458* (2006.01)
*C23C 16/44* (2006.01)

(52) U.S. Cl.
CPC ........... *C23C 16/458* (2013.01); *C23C 16/4401* (2013.01); *C23C 16/4587* (2013.01); *C23C 16/54* (2013.01)

(58) Field of Classification Search
None
See application file for complete search history.

(56) References Cited

U.S. PATENT DOCUMENTS

2008/0317956 A1* 12/2008 Reber et al. .............. 427/255.28

FOREIGN PATENT DOCUMENTS

| CN | 86102741 A | 10/1987 |
| CN | 1495285 A | 5/2004 |
| DE | 102005045582 | 3/2007 |
| DE | 102005045582 B3 | 8/2009 |
| DE | 102009038369 A1 | 3/2011 |
| JP | 06340968 A | 12/1994 |
| JP | 10242132 A | 9/1998 |

OTHER PUBLICATIONS

Huhn DE102009038369 Mar. 2011 Eng mach translation.*
Eng partial translation of German office action 102011106859, Apr. 2015.*
A. Hurrle et al., High-Throughput Continuous CVD Reactor fur Silicon Deposition, 19th European Photovoltaic Solar Energy Conference, Jun. 7-11, 2004, Paris, S. 459-462.

(Continued)

*Primary Examiner* — Joseph Miller, Jr.
(74) *Attorney, Agent, or Firm* — Gesmer Updegrove LLP

(57) ABSTRACT

The invention relates to a method for continuous coating of substrates, in which the substrates are transported continuously through a deposition chamber and, at the same time, measures are adopted for reducing parasitic deposits as well as possible. Likewise, the invention relates to a corresponding device for continuous coating of substrates.

9 Claims, 4 Drawing Sheets

(56) References Cited

OTHER PUBLICATIONS

Office Action issued by the German Intellectual Property Office on May 7, 2014 in connection with German Application No. DE 102011106859.0, 6 pages.

Reber et al., "CONCVD and PROCONCVD Development of High-Throughput CVD Tools on the Way to Low-Cost Silicon Epitaxy" European Photovoltaic Solar Energy Conference and Exhibition, Jan. 1, 2009, pp. 2560-2564.

International Search Report and Written Opinion issued in connection with corresponding PCT Application No. PCT/EP2012/063425 mailed on Nov. 6, 2012.

Chinese Office Action issued in Chinese Patent Application No. 201280033552.1 Jan. 26, 2015.

* cited by examiner

METHOD AND DEVICE FOR CONTINUOUSLY COATING SUBSTRATES

PRIORITY INFORMATION

The present invention is a 371 National Phase Application of PCT/EP2012/063425 filed on Jul. 9, 2012 that claims priority to German Application No. 10201106859.0 filed on Jul. 7, 2011, which are incorporated herein by reference in their entireties.

BACKGROUND OF THE INVENTION

The invention relates to a method for continuous coating of substrates, in which the substrates are transported continuously through a deposition chamber and, at the same time, measures are adopted for reducing parasitic deposits as well as possible. Likewise, the invention relates to a corresponding device for continuous coating of substrates.

It is still an essential aspect for the design of coating plants to produce continuous educt and product flows. However, in the case of coating plants for continuous coating which are known from the state of the art, undesired concomitant phenomena occur during the deposition process.

There are included herein:
The geometry of the deposition chamber can be changed and hence the gas flows. In the case of some deposition conditions, this has an effect on the layer homogeneity and the layer quality.
Transport paths can be blocked by parasitic layers or particles, or friction can be increased, which can lead to blockage of a carrier transport.
Gas paths can be blocked, which can lead to gas escape and hence possibly dangerous situations.
Parasitic layers can flake off, which leads to particle formation in the deposition chamber and hence to "poor" layers, possibly even to total economic loss of the layer.
The uptime of the plant is made worse because the deposits often can be etched back.

To date, different solution concepts have been proposed for the problems listed here (S. Reber et al., CONCVD and PROCONCVD: Development of High-Throughput CVD Tools on the Way to Low-Cost Silicon Epitaxy, 24$^{th}$ European PV Solar Energy Conference and Exhibition, Hamburg and A. Hurrie et al., High-Throughput Continuous CVD Reactor for Silicon Deposition, 19$^{th}$ European Photovoltaic Solar Energy Conference, 2004).

Included herein is the regular cleaning by means of in-situ etching-back of the parasitic layers. However, this method cannot be applied with some layers, e.g. silicon carbide, since these layers are etch-resistant.

Another approach for eliminating parasitic deposits is based on regular ex-situ cleaning. However, this is associated with additional time expenditure.

Furthermore, parasitic deposits can be removed by regular exchanging of the parasitically coated surfaces being effected. However, this represents an expensive variant.

Another approach is based on "high-quality" surfaces being protected from parasitic deposits by means of a cover material. This cover material can be either cleaned ex-situ or exchanged.

Furthermore, it is known to solve the mentioned problems by avoiding contact of the surfaces with process gas by directed gas flow, e.g. gas curtains, gas cushions, etc. However, this variant can only prevent the production of parasitic deposits in a limited manner.

SUMMARY OF THE INVENTION

Starting herefrom, it was the object of the present invention to provide a method and a device for continuous coating with which the parasitic deposits are minimised so that the cycle for removal of parasitic deposits can be significantly reduced.

This object is achieved by the method for continuous coating of substrates having the features of claim 1 and the corresponding device having the features of claim 11. The further dependent claims reveal advantageous developments.

The principle of the present invention is based on the substrate carriers for the workpiece to be coated being designed such that as many as possible of the parasitic surfaces are connected temporarily to the substrate carrier and transported out of the plant with the transport of the workpiece.

According to the invention, a method for continuous coating of substrates is hence provided, in which, in a coating device, the substrates are transported through a deposition chamber which is delimited by two substrate carriers and also a base and a cover, the base having a device for guiding the substrate carriers, the substrates on the substrate carriers being transported through the coating device, the continuous coating of the substrates being effected during the transport and the cover being fixed on the substrate carriers and thus being transported together with the substrate carriers through the coating device.

There should be understood here by a fixing between cover and substrate carrier that these components have a fixed connection during transport through the coating device, i.e. that mutual displacement of cover relative to substrate carriers is prevented. This can be produced in particular by a frictional connection. In contrast to a connection which allows displacement between cover and substrate carrier, as is known from the state of the art, the advantage according to the invention resides here in the fact that, on the one hand, the friction between the components (and the disadvantage associated therewith of the formation of abraded particles) can be prevented and, on the other hand, a significant more effective sealing of the deposition chamber is made possible.

In the case of fixing of cover and substrate carrier, a detachable connection is preferred. As a result, the cover can be separated from the substrate carriers outside the deposition chamber and can be cleaned, for example, separately from the substrate carriers.

The most important advantages of the method according to the invention are intended to be summarised briefly once again:
Because of the fixing of the substrate carriers to a cover, no friction occurs between these components, as a result of which particles which are produced by friction between the rails and the substrate carriers are prevented, which particles can enter into the deposition chamber and reduce the quality of the deposition there.
By means of the fixing according to the invention of the substrate carriers to a cover, a significantly improved sealing of the components is achieved, which is not possible when using rails for the substrate carriers.
Since the cover is significantly smaller, in comparison with a plate with guide rails, with respect to dimensioning, improved dimensional accuracy for the component can be ensured.

According to the invention, a zone for the substrates is preferred in which the cover and the substrate carriers, which delimit the deposition chamber next to the base, can be cleaned or removed for cleaning. In the first case, of concern hereby is a cleaning zone, in the second case a removal zone, with which in-situ cleaning or ex-situ cleaning is made possible.

An embodiment according to the invention provides that one wall is configured as a cover which is fixed to the substrate carriers and is thus transported together with the substrate carriers out of the deposition chamber and subsequently the parasitic deposits on this cover are removed. Subsequently, the cover can be used again in the case of a further coating cycle.

It is further preferred that at least one cover element (8) is disposed in front of the base (2) in the deposition chamber (4).

A further embodiment according to the invention provides that a sacrificial layer, as cover element, is deposited on at least one of the elements which delimit the deposition chamber. This sacrificial layer serves to facilitate subsequent etching-back or to simplify it. The sacrificial layer can also be removed from the elements which delimit the deposition chamber. The removal of such a sacrificial layer is possible both in the coating device and outside the coating device.

The sacrificial layer is designed such that etching-back of parasitic deposits is decisively simplified. This simplification can reside for example in reducing the adhesive strength of parasitic deposits (separation layer), in not changing mechanical properties of the carrier material (material distortion) or preventing penetration of parasitic deposits into porous materials.

The sacrificial layer can be for example a carbon layer, in particular a carbon black layer, or a powder layer, in particular made of silicon dioxide or silicon nitride.

A further variant according to the invention provides that cloths, foils, lamellae, combs, sealing lips or O-rings are used as cover element.

It is further preferred that, in an etching-back zone inside the coating plant, parasitic deposits are removed by etching from the elements (at least one) which delimit the deposition chamber and from the cover elements described previously.

The etching-back zone can thereby be disposed in front of, in or after the deposition chamber.

Preferably, in the etching-back zone, an etching means is guided through at least one nozzle and is directed towards at least one of the elements which delimit the deposition chamber and/or towards at least one of the cover elements which are disposed in front of at least one of the delimiting elements in the deposition chamber for etching of parasitic deposits on these elements.

According to the invention, a device is made available for continuous coating of substrates having a deposition chamber which is provided for the chemical vapour deposition, the deposition chamber being delimited by two substrate carriers and also a base and a cover. The base thereby has a device for guiding the substrate carriers. The cover is fixed to the substrate carriers and can therefore be transported together with the substrate carriers (1, 1') through the coating device so that the cover (6) and the substrate carriers (1, 1') can be transported together with the substrate out of the deposition chamber (4). The substrates on the substrate carriers can thereby be transported through the coating device and, during the transport, the continuous coating of the substrates is effected.

Preferably, the device for guiding the substrate carriers is at least one rail.

The invention thereby has the following advantages which lead to the solution to the above-mentioned problems:

As a result of the immediate removal of the parasitic deposit after each coating cycle, geometric changes in the deposition chamber only take place on an irrelevant scale.

Blockage or obstruction of the sample transport is minimised since particles are produced typically only for thick layers, i.e. are avoided.

No thick layers which block gas paths can be formed.

By avoiding flaking-off, the danger of poor layers is minimised.

As a result of the continuous ex-situ cleaning, the plant can operate without interruption, in the ideal case entirely without cleaning cycles, i.e. the uptime is greatly increased.

The present invention is applied in plants and apparatus, in particular coating plants, in which parasitic deposits occur and which have a continuous feed.

The present invention also comprises the following aspects:

1. Method for continuous coating of substrates in which the substrates are transported through a deposition chamber (4), which is delimited by two substrate carriers (1, 1') and also two walls (2, 2'), of which at least one wall (2, 2') has a device (3, 3') for guiding the substrate carriers (1, 1), the substrates on the substrate carriers (1, 1') are transported through the deposition chamber and, during the transport, the continuous coating of the substrate is effected, characterised in that at least one of the elements (1, 1', 2, 2') which delimit the deposition chamber (4) and/or at least one of the cover elements (8, 8') which are disposed in front of at least one of the delimiting elements (1, 1', 2, 2') in the deposition chamber (4) and protect the delimiting elements (1, 1', 2, 2') from parasitic deposits, is transported together with the substrate out of the deposition chamber (4).

2. Method according to aspect 1, characterised in that the device has a zone for the substrates, in which at least one of the elements (1, 1', 2, 2') which delimit the deposition chamber (4) and/or at least one of the cover elements (8, 8') which are disposed in front of at least one of the delimiting elements (1, 1', 2, 2') in the deposition chamber (4) can be cleaned or removed for cleaning.

3. Method according to one of the preceding aspects, characterised in that one wall is configured as a cover (6) which is fixed to the substrate carriers (1, 1') and thus is transported together with the substrate carriers (1, 1') out of the deposition chamber (4) and subsequently the parasitic deposits on the cover (6) are removed.

4. Method according to one of the preceding aspects, characterised in that a sacrificial layer, as cover element (8, 8'), is deposited on at least one of the elements (1, 1', 2, 2') which delimit the deposition chamber (4).

5. Method according to the preceding aspect, characterised in that the sacrificial layer is a carbon layer, in particular a carbon black layer, or a powder layer, in particular made of silicon dioxide or silicon nitride.

6. Method according to one of the preceding aspects, characterised in that cloths, foils, lamellae, combs, sealing lips or O-rings are used as cover element (8, 8').

7. Method according to one of the preceding aspects, characterised in that, in an etching-back zone, the parasitic deposits are removed by means of etching from at least one of the elements (1, 1', 2, 2') which delimit the deposition chamber (4) and/or from at least one of the cover elements (8, 8') which are disposed in front of at least one of the delimiting elements (1, 1', 2, 2') in the deposition chamber (4).

8. Method according to the preceding aspect, characterised in that the etching-back zone is disposed in front of, after or in the deposition chamber (4).

9. Method according to one of the aspects 6 or 7,
   characterised in that, in the etching-back zone, an etching means is guided through at least one nozzle and is directed towards at least one of the elements (1, 1', 2, 2') which delimit the deposition chamber (4) and/or towards at least one of the cover elements (8, 8') which are disposed in front of at least one of the delimiting elements (1, 1', 2, 2') in the deposition chamber (4) for etching of parasitic deposits on these elements.
10. Device for continuous coating of substrates having a deposition chamber (4) which is provided for the chemical vapour deposition and is delimited by two substrate carriers (1, 1') and also two walls (2, 2'), of which at least one wall (2, 2') has a device (3, 3') for guiding the substrate carriers (1, 1),
    characterised in that at least one of the elements (1, 1', 2, 2') which delimit the deposition chamber (4) and/or at least one of the cover elements (8, 8') which are disposed in front of at least one of the delimiting elements (1, 1', 2, 2') in the deposition chamber (4) and protect the delimiting elements (1, 1', 2, 2') from parasitic deposits can be transported, in that it can be transported out of the deposition chamber (4) together with the substrate.
11. Device according to the preceding aspect,
    characterised in that the device has a zone for the substrates, in which at least one of the elements (1, 1', 2, 2') which delimit the deposition chamber (4) and/or at least one of the cover elements (8, 8') which are disposed in front of at least one of the delimiting elements (1, 1', 2, 2') in the deposition chamber (4) can be cleaned or removed for cleaning.
12. Device according to one of the aspects 10 or 11,
    characterised in that one wall is designed as a cover (6) which is fixed to the substrate carriers (1, 1') for common transport with the substrate carriers (1, 1') out of the deposition chamber (4).
13. Device according to one of the aspects 10 to 12,
    characterised in that the cover element (8, 8') is a sacrificial layer.
14. Device according to the preceding aspect,
    characterised in that the sacrificial layer is a carbon layer, in particular a carbon black layer, or a powder layer, in particular made of silicon dioxide or silicon nitride.
15. Device according to one of the aspects 10 to 14,
    characterised in that the cover element (8, 8') is selected from the group consisting of cloths, foils, lamellae, combs, sealing lips or O-rings and combinations hereof.
16. Device according to one of the aspects 10 to 15,
    characterised in that the device has an etching-back zone in which the parasitic deposits are removed by means of etching from at least one of the elements (1, 1', 2, 2') which delimit the deposition chamber (4) and/or from at least one of the cover elements (8, 8') which are disposed in front of at least one of the delimiting elements (1, 1', 2, 2') in the deposition chamber (4).
17. Device according to the preceding aspect,
    characterised in that the etching-back zone is disposed in front of, after or in the deposition chamber (4).
18. Device according to one of the aspects 16 or 17,
    characterised in that, in the etching-back zone, at least one nozzle for an etching agent is disposed, the nozzle being directed towards at least one of the elements (1, 1', 2, 2') which delimit the deposition chamber (4) and/or towards at least one of the cover elements (8, 8') which are disposed in front of at least one of the delimiting elements (1, 1', 2, 2') in the deposition chamber (4) for etching of parasitic deposits on these elements.
19. Device according to one of the aspects 10 to 18,
    characterised in that the devices (3, 3') for guiding the substrate carriers (1, 1') are rails.

DETAILED DESCRIPTION OF THE ILLUSTRATED EMBODIMENTS

The subject according to the invention is intended to be explained in more detail with reference to the subsequent Figures without wishing to restrict said subject to the special embodiments shown here.

Figure 1:
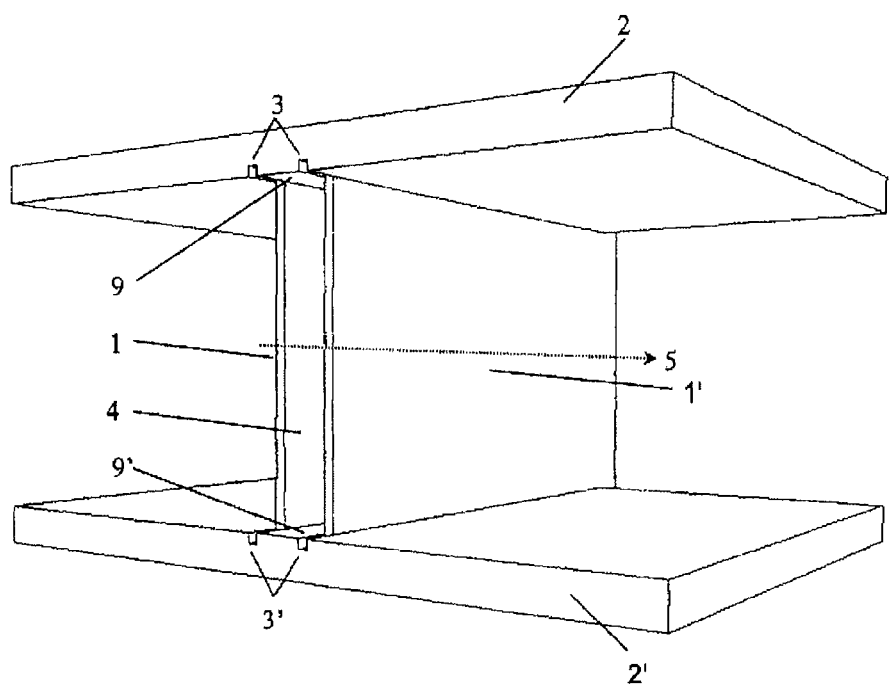
FIG. 1 shows an embodiment of a deposition plant known from the state of the art.

In FIG. 1, an arrangement is represented, in which two substrate carriers 1 and 1' are disposed in parallel. These two substrate carriers are transported along an upper rail 3 and a lower rail 3'. The process gases are conducted into the formed inner cavity 4 where the deposition process takes place. The two rails 3 and 3' are mounted rigidly, a parasitic deposit takes place on the roof of the reaction chamber 9 and on the base of the reaction chamber 9'. In addition, by friction between the rails 3 and 3' and the substrate carriers 1 and 1', particles are produced which can enter into the deposition chamber 4 and reduce the quality of the deposition there.

Figure 2:
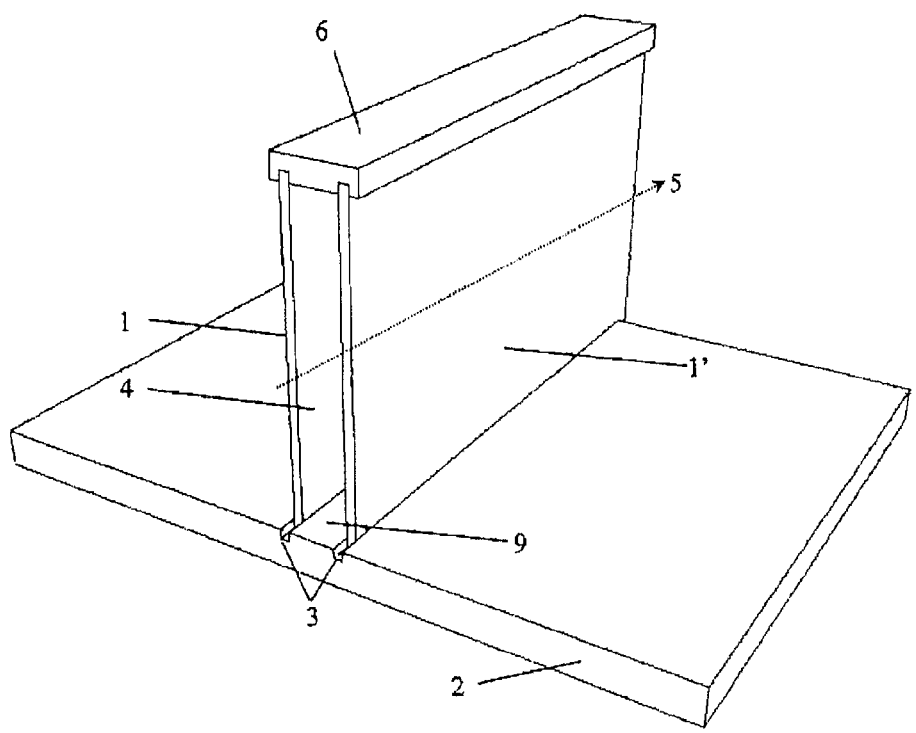
FIG. 2 shows a first variant of a device according to the invention with reference to a schematic representation.

In FIG. 2, an arrangement according to the invention is represented, in which the upper rail (represented in FIG. 1 as 3) has been replaced by a cover 6 placed thereon. The cover 6 moves with the substrate carriers 1 and 1' through the coating plant. In the case of this variant, a parasitic coating will take place in fact likewise on the inside 9, however this can be removed easily ex-situ. For this purpose, mechanical and also chemical methods are available. Possible locks are adapted to the rotated U-geometry represented here so that the now moveable cover 6 is jointly sealed.

Figure 3:
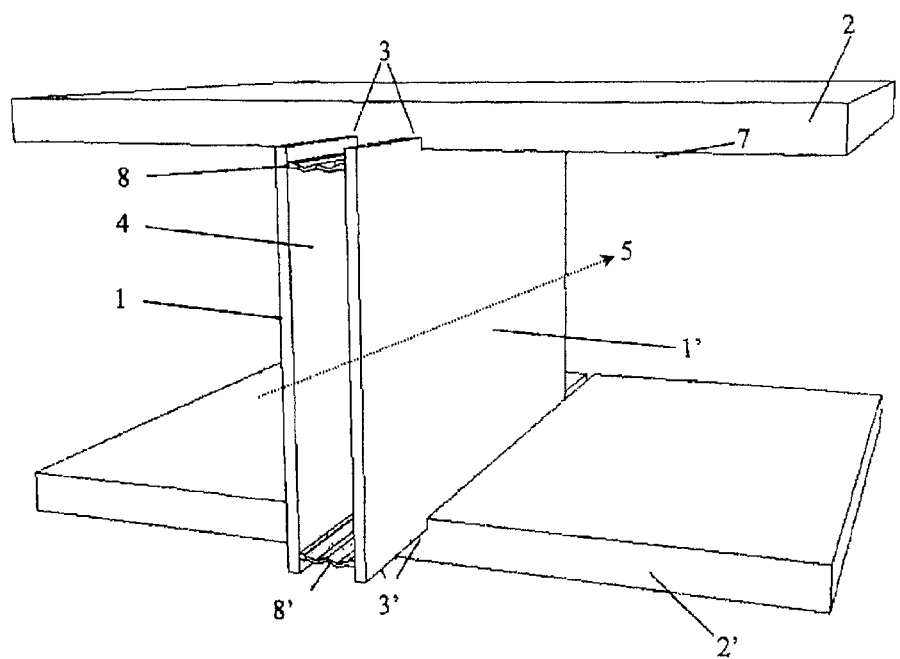
FIG. 3 shows a further variant of a device according to the invention with reference to a schematic representation.

In FIG. 3, a further device according to the invention is represented, in which, in contrast to the state of the art according to FIG. 1, abrasive cloths 8 and 8' which are moveable respectively in the vertical direction are disposed in the region of the upper rail 3 and of the lower rail 3', which abrasive cloths cover the respective rails. In the deposition regions, these cloths 8 and 8' are situated in front of the respective rails and hence absorb all parasitic deposits. Subsequently, the cloths 8 and 8' are guided outwards with the substrates where they can be cleaned or disposed of. In the regions of locks, inlet nozzles etc. which protrude from below vertically into the deposition zone, the cloth can be pressed by a suitable guide into the vertical so that it can move past all inserts.

Figure 4:
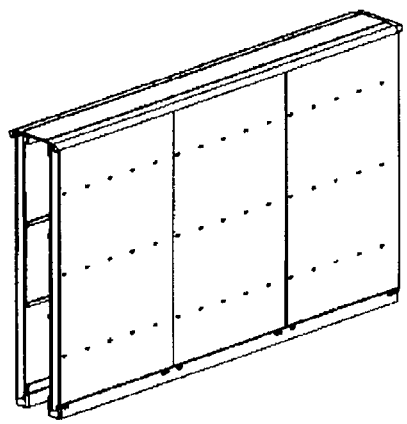
FIG. 4 shows a variant of the device according to the invention with reference to a schematic representation.

In FIG. 4, a device according to the invention is represented in which the substrate carriers 1 and 1' are fixed to a cover 6. This unit of cover and substrate carriers is transported through the coating device. The guide rails 3 are disposed on the base 2, not represented. Here also, the gas locks can be adapted to the represented reversed U-shape so that the cover 6 is jointly sealed.

Figure 5:
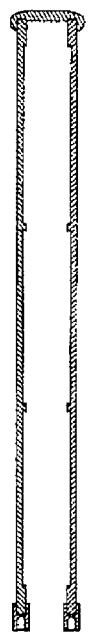
FIG. 5 shows a sectional representation of the device according to the invention according to FIG. 4.

In FIG. 5, a sectional representation of the unit of substrate carriers 1 and 1' and also the cover 6 is represented. It can be detected hereon that the cover 6 is connected frictionally to the substrate carriers 1 and 1' by means of a clamp connection.

What is claimed is:

1. A device for continuous coating of substrates having a deposition chamber which is provided for the chemical vapour deposition and is delimited by two substrate carriers and also a base and a cover, the base having a device for guiding the substrate carriers, and the cover having a fixed connection to the substrate carriers and thus being able to be transported together with the substrate carriers through the coating device, in that the cover and the substrate carriers together with the substrate can be transported out of the deposition chamber, said fixed connection serving to steal the deposition chamber.

2. The device according to claim 1,
wherein the device has a zone in which the cover and the substrate carriers can be cleaned or removed for cleaning.

3. The device according to claim 1,
wherein at least one cover element is disposed in front of the base in the deposition chamber.

4. The device according to claim 1,
wherein the cover element is a sacrificial layer.

5. The device according to claim 4,
wherein the sacrificial layer is a carbon layer, or a powder layer made of silicon dioxide or silicon nitride.

6. The device according to claim 1,
wherein the cover element is selected from the group consisting of cloths, foils, lamellae, combs, sealing lips or O-rings and combinations hereof.

7. The device according to claim 1,
wherein the device has an etching-back zone which is disposed in front of, after or in the deposition chamber.

8. The device according to claim 6,
wherein, in the etching-back zone, at least one nozzle for an etching agent is disposed, the nozzle being directed towards at least one of the elements which delimit the deposition chamber and/or towards at least one of the cover elements which are disposed in front of the base in the deposition chamber for etching of parasitic deposits on these elements.

9. The device according to claim 1,
wherein the device for guiding the substrate carriers is at least one rail.

* * * * *